United States Patent
Dimmler

(10) Patent No.: US 7,176,053 B1
(45) Date of Patent: Feb. 13, 2007

(54) LASER ABLATION METHOD FOR FABRICATING HIGH PERFORMANCE ORGANIC DEVICES

(75) Inventor: Klaus Dimmler, Colorado Springs, CO (US)

(73) Assignee: OrganicID, Inc., Colorado Springs, CO (US)

( * ) Notice: Subject to any disclaimer, the term of this patent is extended or adjusted under 35 U.S.C. 154(b) by 0 days.

(21) Appl. No.: 11/204,724

(22) Filed: Aug. 16, 2005

(51) Int. Cl.
*H01L 51/40* (2006.01)

(52) U.S. Cl. .................... 438/99; 257/E21.033

(58) Field of Classification Search .................... 438/99
See application file for complete search history.

(56) References Cited

U.S. PATENT DOCUMENTS

| | | | |
|---|---|---|---|
| 6,602,790 B2 | 8/2003 | Kian et al. | |
| 6,737,338 B2 | 5/2004 | Takeda | |
| 6,762,124 B2 | 7/2004 | Kian et al. | |
| 2003/0178620 A1* | 9/2003 | Bernds et al. | 257/40 |
| 2004/0266054 A1* | 12/2004 | Brazis et al. | 438/99 |
| 2006/0138423 A1* | 6/2006 | Hirai | 257/59 |

OTHER PUBLICATIONS

James R. Sheats, "Manufacturing and Commercialization Issues In Organic Electronics", Journal of Materials Resarch, Materials Research Society, vol. 19, No. 7, pp. 1974-1989.*

* cited by examiner

*Primary Examiner*—W. David Coleman
(74) *Attorney, Agent, or Firm*—Peter J. Meza; Hogan & Hartson LLP

(57) ABSTRACT

A laser ablation method is utilized to define the channel length of an organic transistor. A substrate is coated with a deposition of a metal or conductive polymer deposition, applied in a thin layer in order to enhance the resolution that can be attained by laser ablation. The laser ablation method can be used in a roll-to-roll process, and achieves speeds, volumes, prices and resolutions that are adequate to produce printed electronic technologies.

25 Claims, 12 Drawing Sheets

LASER ABLATION METHOD FOR FABRICATING HIGH PERFORMANCE ORGANIC DEVICES

BACKGROUND

1. Field of Invention

The present invention relates to organic transistors and, more particularly, to a laser ablation method of fabricating high performing organic FETs utilizing an efficient high volume patterning technique to define the channel length.

2. Description of Related Art

Organic MOS transistors are similar to silicon metal-oxide-semiconductor transistors in operation. The major difference in construction is that the organic MOS transistor utilizes a thin layer of a semiconducting organic polymer film to act as the semiconductor of the device, as opposed to a silicon layer as used in the more typical in-organic silicon MOS device.

Referring now to FIG. 1, a cross-sectional diagram of a bottom-gate bottom-contact organic MOS transistor 100 is shown. A metallic region 122 is deposited on an insulating substrate 112 forming the gate 122 of the organic MOS device 100. A thin dielectric region 120 is placed on top of gate region 122 to electrically isolate it from other layers and to act as the MOS gate insulator. Metallic conductors 118 and 116 are formed on the dielectric region 120 above the gate region 122 such that there is a gap 124 between conductors 116 and 118 overlapping gate metal 122. The gap 124 is known as the channel region of transistor 100. A thin film of organic semiconducting material 114 is deposited on dielectric region 120 and over at least a portion of metallic conductors 116 and 118. A voltage applied between the gate 122 and the source 118 modifies the resistance of the organic semiconductor film 114 in gap region 124 in the vicinity of the interface between semiconductor region 124 and dielectric 120. This is defined as the "field effect". When another voltage is applied between the source 118 and the drain 116, a current flows between the drain and source with a value dependent on both the gate-to-source and the drain-to-source voltages.

An organic transistor 200 can also be constructed as a bottom-gate top-contact structure as shown in FIG. 2. Conductor layer 222 is deposited and patterned on substrate 212. A dielectric layer 220 is deposited on conductor layer 222. A thin film of semiconductor material 214 is deposited on top of dielectric layer 220. A conductive film is deposited and patterned on top of organic semiconductor 214 to form conductive source and drain regions 216 and 218, such that there is a gap 224 that overlaps the underlying gate metal layer 222. The gap 224 is known as the channel region of transistor 200. Through the field effect, a voltage is applied between gate conductor 222 and source 218 that modifies the resistance of the organic semiconductor 214 in the gap region 224 in the vicinity of the interface between the semiconductor region 214 and the dielectric 220. When another voltage is applied between source 218 and drain 216, a current flows between the drain and the source with a value dependence on both the gate-to-source and the drain-to-source voltages.

Organic transistor 300 can also be constructed as a top gate structure as shown in FIG. 3. A conductive film is deposited and patterned on an insulating substrate 312 to form conductive regions 318 and 316. One of these conductive regions is known as the source 318, and the other as the drain 316. The gap 324 between source 318 and drain 316 is the channel region of transistor 300. A thin organic semiconductor layer 326 is deposited on top of these conductive regions such that the entire gap 324 and at least a portion of conductive regions source 318 and drain 316 are covered. A dielectric layer 320 is deposited on top of semiconductor layer 326. A conductive layer 322 is deposited and patterned such that at the underlying gap 324 and at least a portion of the source 316 and the drain 316 are covered. The field effect causes the resistance of the organic semiconductor 326 inside the gap 324 in the vicinity of the interface between the semiconductor 326 and the dielectric 320 to decrease as a voltage is applied between the gate 322 and the source 318. When another voltage is applied between the source 318 and the drain 316, current flows between the source 318 and the drain 316. The value of the current depends on the voltage between gate 322 and the source 318.

In all of the structures shown in FIGS. 1–3, all layers may be patterned as long as the gate conductor overlaps the channel region gap and at least a portion of the source and drain, and organic semiconductor and dielectric are placed so that the gate conductor and the source/drain conductor are electrically isolated.

Organic semiconductor materials are often classified as polymeric, low molecular weight, or hybrid. Pentacene, hexithiphene, TPD, and PBD are examples of low weight molecules. Polythiophene, parathenylene vinylene, and polyphenylene ethylene are examples of polymeric semiconductors. Polyvinyl carbazole is an example of a hybrid matrial. These materials are not classified as insulators or conductors. Organic semiconductors behave in a manner that can be described in terms analogous to the band theory in inorganic semiconductors. However, the actual mechanics giving rise to charge carriers in organic semiconductors are substantially different from inorganic semiconductors. In inorganic semiconductors, such as silicon, carriers are generated by introducing atoms of different valences into a host crystal lattice, the quantity of which is described by the number of carriers that are injected into the conduction band, and the motion of which can be described by a wave vector k. In organic semiconductors, carriers are generated in certain materials by the hybridization of carbon molecules in which weakly bonded electrons, called $\pi$ electrons, become delocalized and travel relatively far distances from the atom which originally gave rise to that electron. This effect is particularly noted in materials comprising of conjugated molecules or benzene ring structures. Because of the delocalization, these $\pi$ electrons can be loosely described as being in a conduction band. This mechanism gives rise to a low charge mobility, a measure describing the speed with which these carriers can move through the semiconductor, resulting in dramatically lower current characteristics of organic semiconductors in comparison to inorganic semiconductors.

Though organic transistors have much lower performance than inorganic transistors, the materials and processing techniques to produce organic transistors cost significantly less than those used to produce inorganic transistors. Therefore, organic transistor technology has application where low cost is desired and low performance is acceptable. As the effective performance of an organic transistor is increased, the number of applications for organic transistor technology also increases. An example of this type of application is Radio Frequency Identification (RFID) tags. Though RFID tags can be produced that operate at any frequency, it is desirable to produce RFID tag using frequency ranges that are used in typical applications. One such typical frequency for RFID tags is 13.56 Mhz, a frequency that is well above the unity gain frequency of organic transistors, and in the range where non-quasi-static behavior needs to be taken into account.

The performance of an organic transistor is proportional to the charge mobility divided by the channel length squared. Therefore, the channel length, the gap between the source and drain, is a very strong function of the performance of an organic transistor. With a manufacturable technology capable of more finely defining this channel length, the performance of the organic transistor is greatly enhanced.

Conventional techniques for defining features during organic field effect transistor (OFET) fabrication have typically involved the use of photolithography and vacuum deposition. However, such methods do not result in the low price points that are desired. Though photolithography can define fine channel length dimensions, these techniques are not practically applied to the construction of low-cost organic technology due to cost of the many steps involved-photo resist spin, photo resist expose, photo resist develop, etch, photo resist removal, and clean. Some more efficient techniques for printing fine resolutions have been explored, such as microcontact printing (μ-CP). With this technique, smaller feature sizes have been demonstrated. However, μ-CP has not been shown to be compatible with large-scale production due to fragile print stamps, alignment issues, and poor throughput. Another approach has involved pre-patterning the substrate before printing where a photomask may be used to define a hydrophobic region within a channel with surrounding hydrophilic regions. The modified wetting properties of the substrate generally afford a narrower feature size after printing than would otherwise be achievable without the use of such feature-enhancing techniques. While this method has been demonstrated in certain laboratory settings, it is uncertain whether this process can be made cost effective for mass production. Notwithstanding the preceding, a method of forming sufficiently narrow channels that is compatible with existing manufacturing processes is desirable for improved or otherwise suitable OFET performance.

SUMMARY OF INVENTION

According to the present invention, laser ablation is utilized to define the channel length of an organic transistor. In an embodiment of this invention, a substrate is coated with a deposition of a metal or conductive polymer deposition, applied in a thin layer in order to enhance the resolution that can be attained by laser ablation.

According to an embodiment of the present invention, the laser ablation technique can be used in a roll-to-roll process, and even though it is a subtractive technique as opposed to additive printing techniques, it does have the potential to achieve speeds, volumes, prices and resolutions that are adequate to produce printed electronic technologies. Laser ablation is removal of material through the use of light. The ability of the material to absorb laser energy limits the depth to which that energy can perform useful ablation. Ablation depth is determined by the absorption depth of the material and the heat of vaporization of the work material. The depth is also a function of beam energy density, the laser pulse duration, and the laser wavelength. Laser energy per unit area on the work material is measured in terms of the energy fluence.

DESCRIPTION OF THE DRAWINGS

The present invention is illustrated by way of example and not by limitation in the accompanying figures in which like reference numerals indicate similar elements and in which.

DETAILED DESCRIPTION

Figure 1:
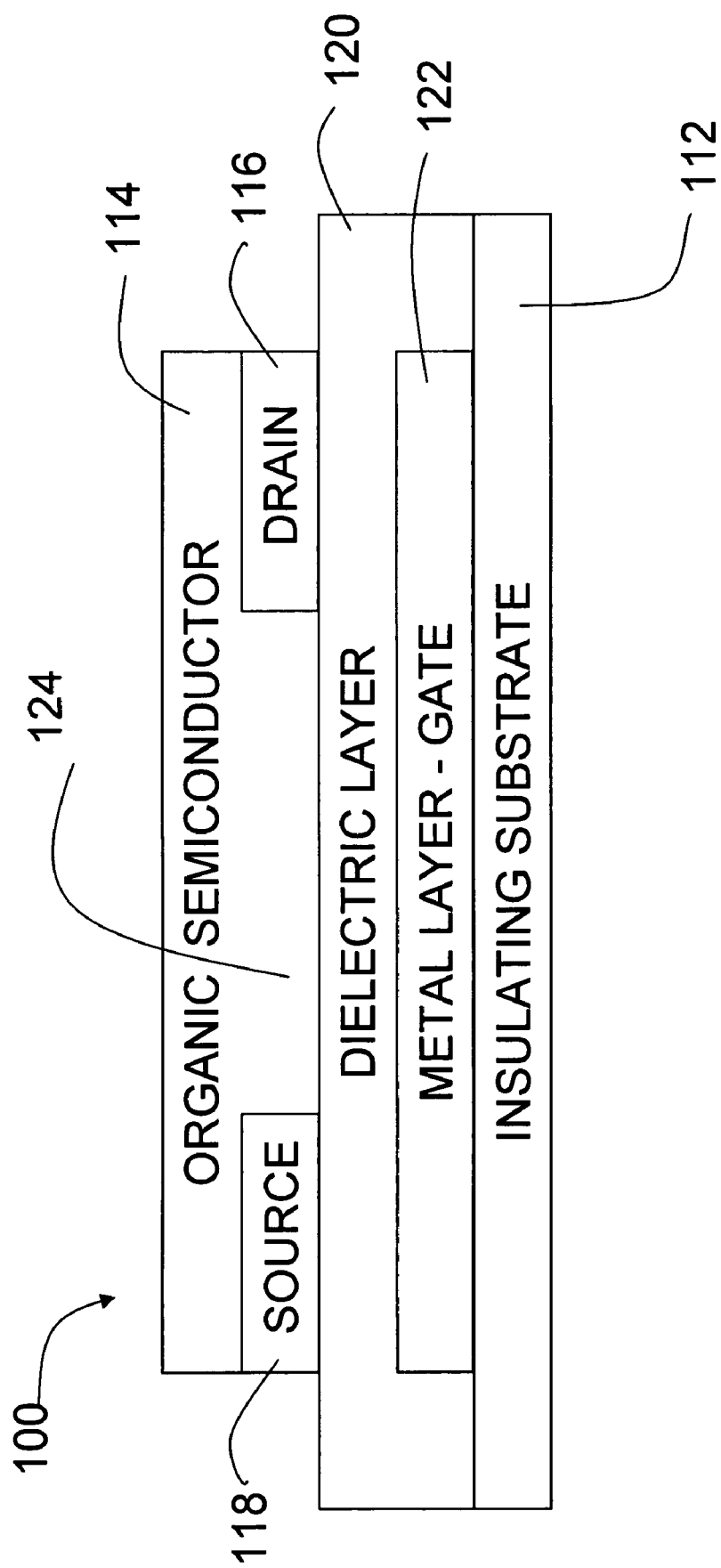
FIGS. 1–3 are cross-sectional views of an inorganic MOS transistor including an insulating substrate, organic polymer film, dielectric layer, and conductive gate according to the prior art.
Figure 2:
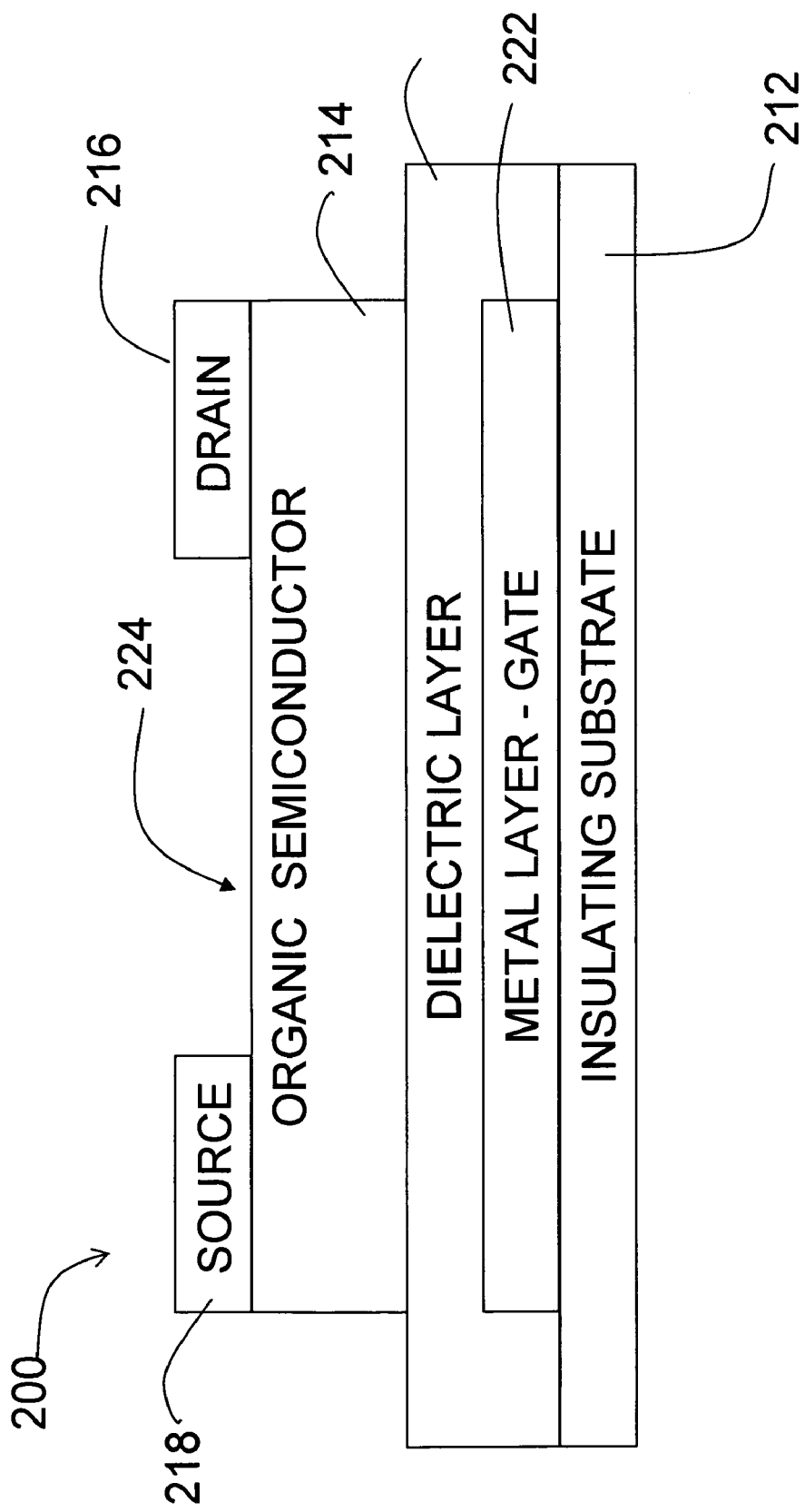
Figure 3:
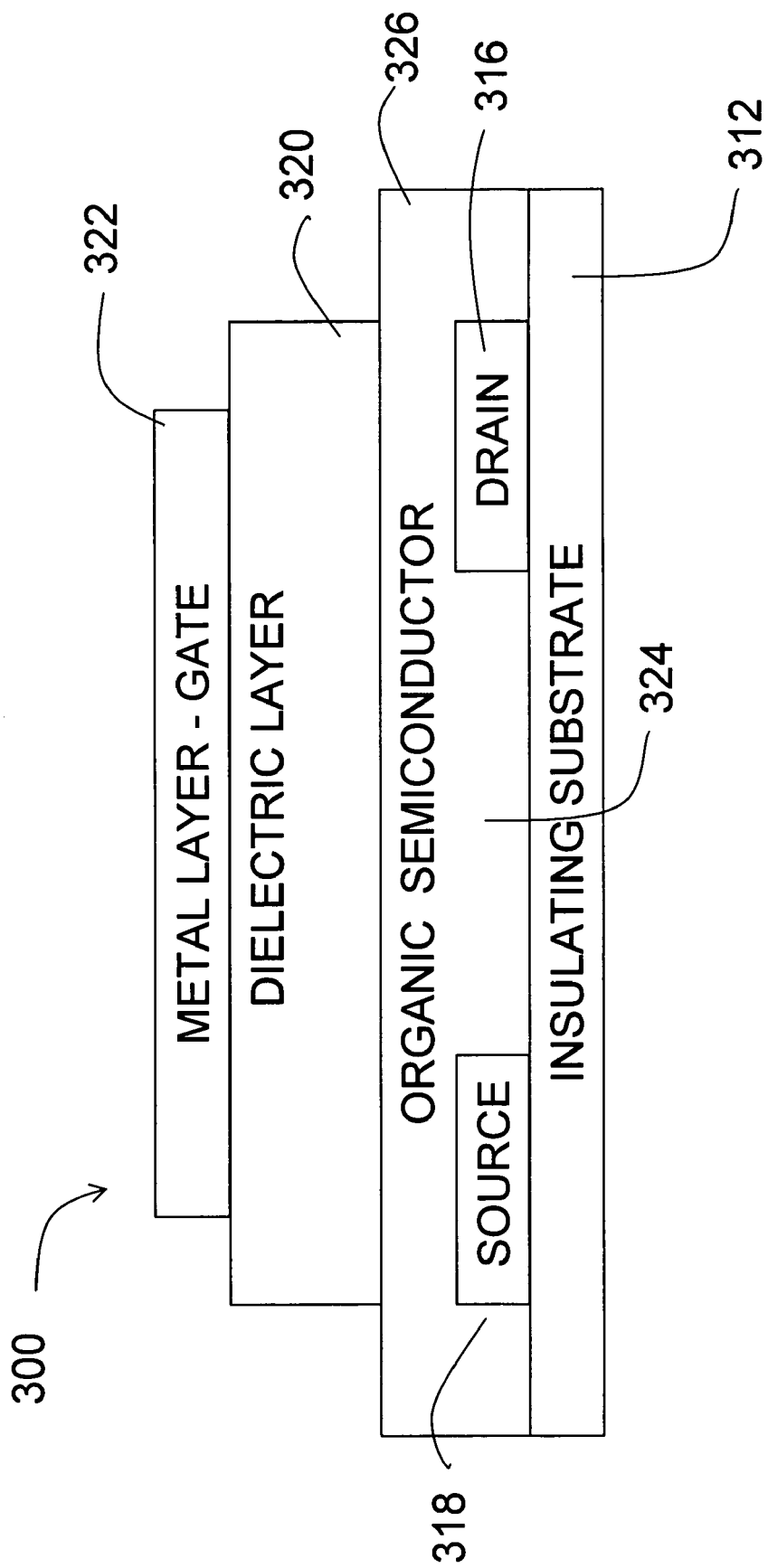
Figure 4:
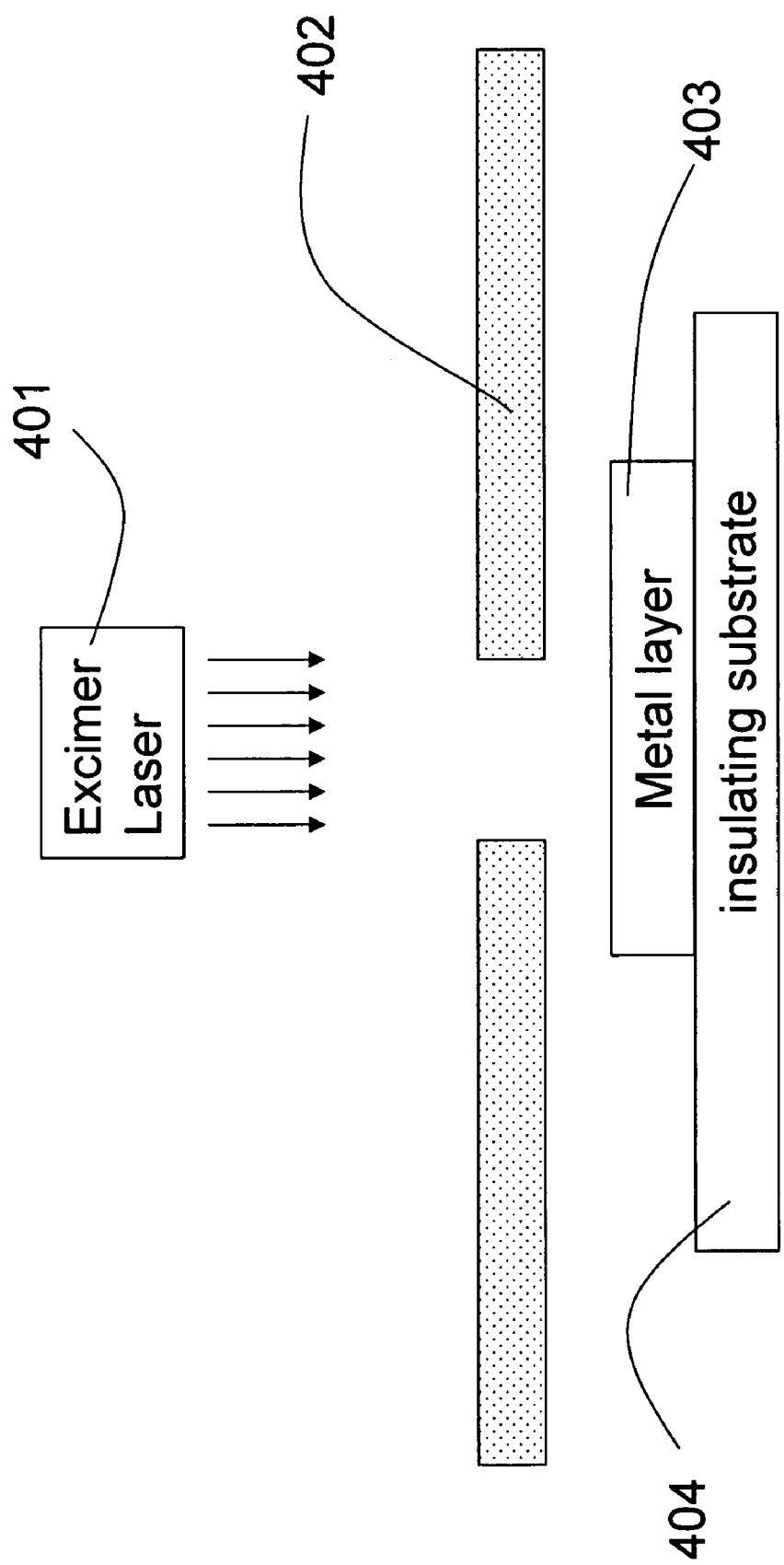
FIG. 4 illustrates a laser ablation system according to the present invention to pattern a metal layer of a top gate transistor structure.

Referring to FIG. 4, a system for laser ablation of a metal layer of a top gate organic transistor is shown. The light from an excimer laser 401 is appropriately blocked by photomask 402, and impacts the metal layer 403 on insulating substrate 404 where there is an opening in the photomask 402. The light energy is of appropriate wavelength, absorption depth, pulse width, and repetition rate as to vaporize the metal where the light impacts on the metal. Laser ablation can typically ablate line width of 10 μm and higher. In one embodiment of this invention, the metal layer 404 is made unusually thin, 20 nm to 60 nm, in order to attain a capability to ablate much finer lines, in the order of 2 μm to 4 μm.

Figure 5:
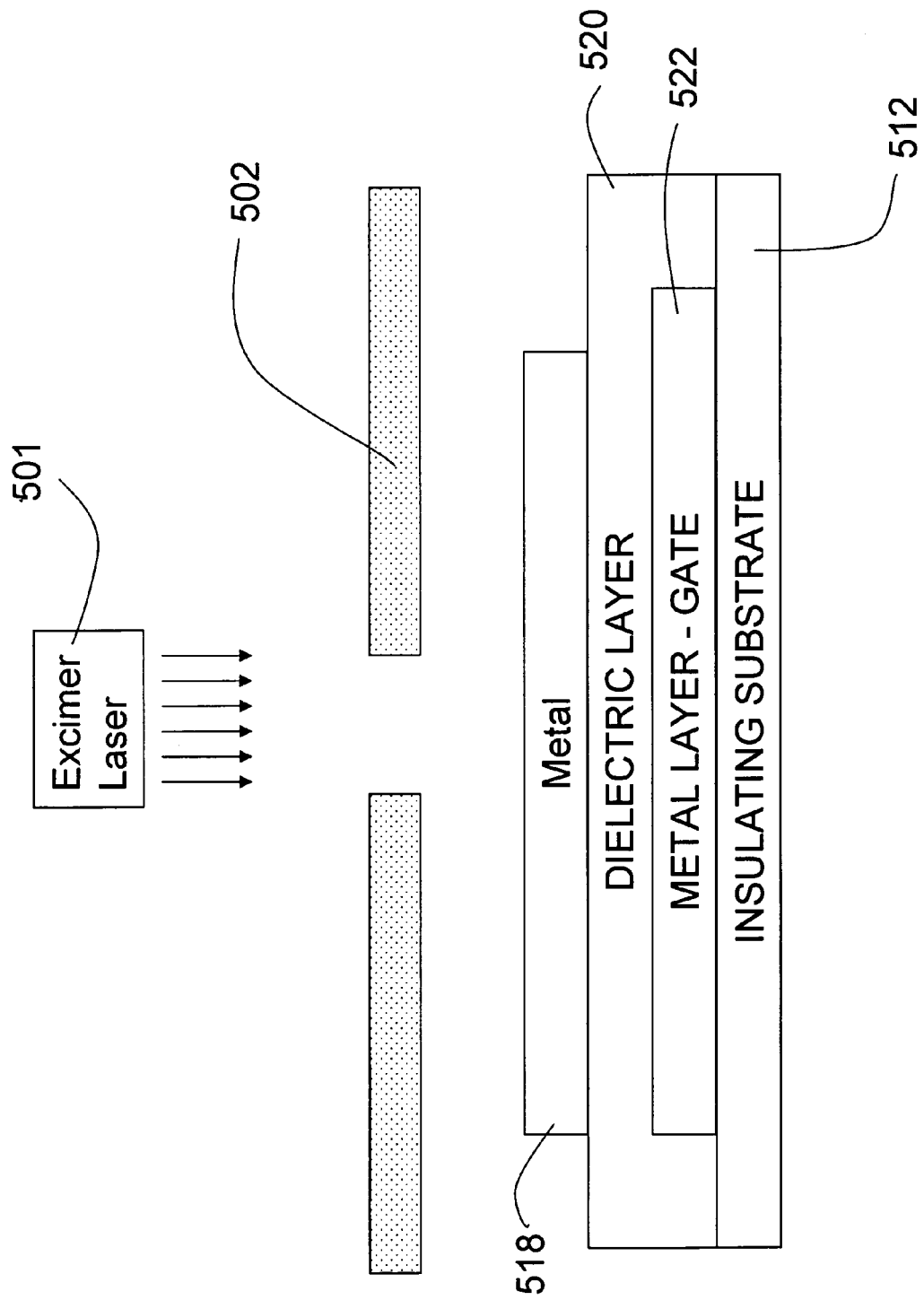
FIG. 5 illustrates a laser ablation system according to the present invention to pattern a metal layer of a bottom gate, bottom contact transistor structure.

FIG. 5 shows the same system described above when applied to the definition of the channel on a bottom gate, bottom contact device. In this case, the metal layer 518 being ablated is on top of dielectric layer 520.

Figure 6:
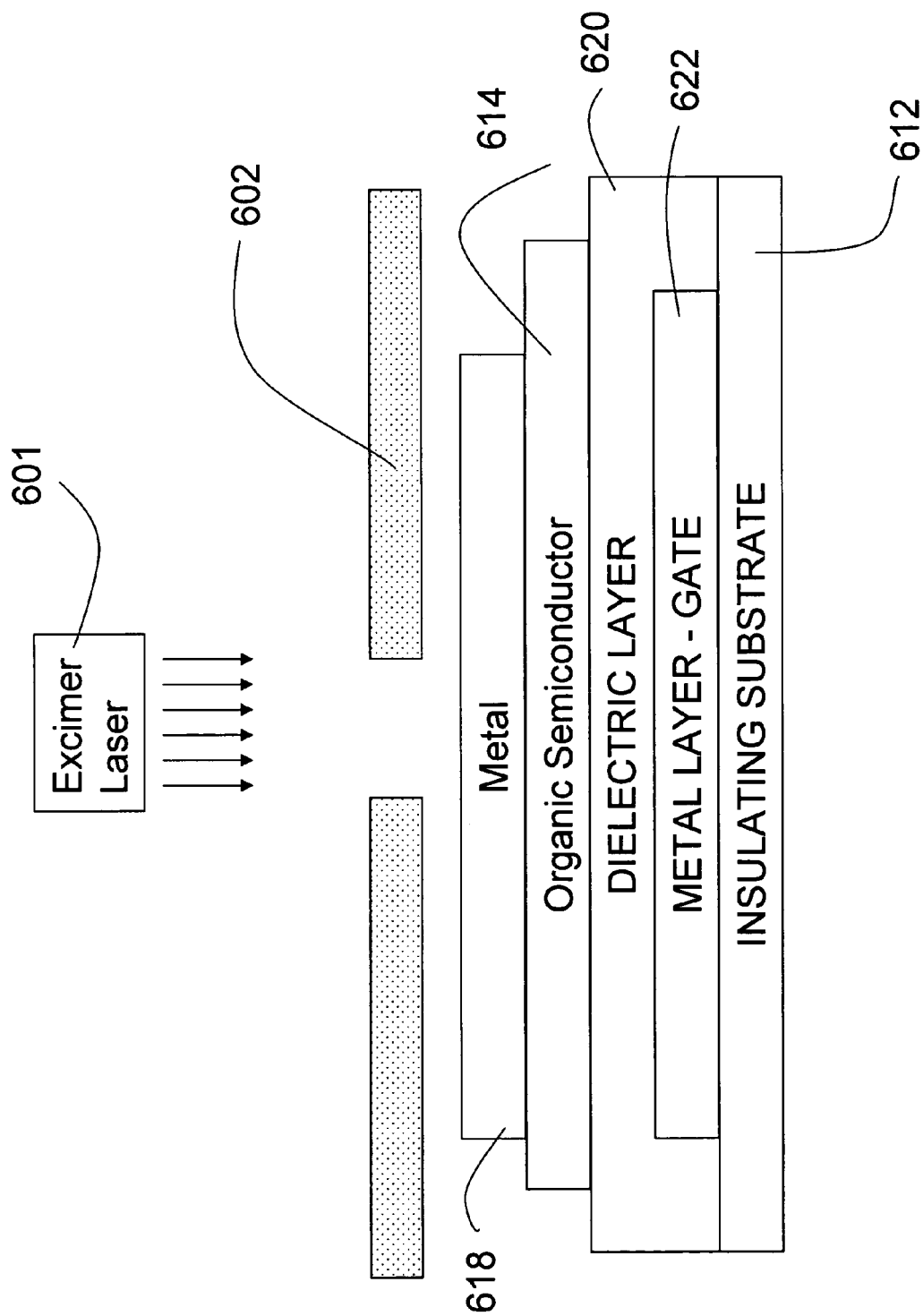
FIG. 6 illustrates a laser ablation system according to the present invention to pattern a metal layer of a bottom gate, top contact transistor structure.

FIG. 6 shows the same system described above when applied to the definition of the channel on a bottom gate, top contact device. In this case, the metal layer 618 being ablated is on top of semiconductor layer 614.

Figure 7:
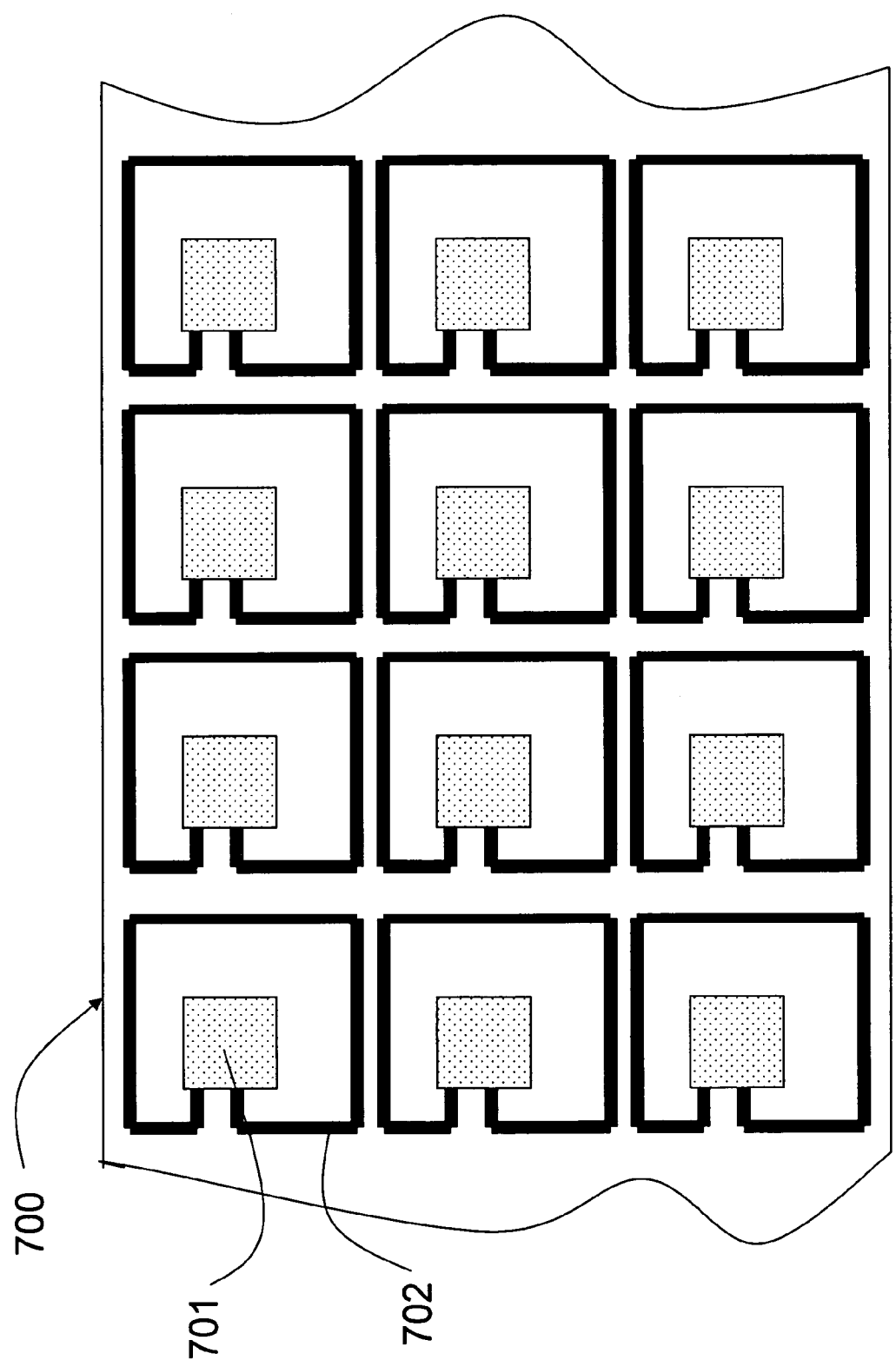
FIG. 7 illustrates a pattern of RFID tags and antennas on a substrate during production.

Though the above figures show only one opening of the photomask, actually the patterning of all metal within the exposure area of the laser ablation system is patterned all at once. In this sense, laser ablation is a subtractive process, requiring that the substrate is coated with the material of choice, and is then removed in appropriate areas by laser ablation as defined by a mask. In one embodiment, a large substrate is covered with a material of choice and with a single ablation exposure defined multiple RFID tags and antennas to create a pattern as shown in FIG. 7. Substrate 700 consists of a multiplicity of RFID tags 701, each circuit surrounded by a printed antenna metal 702. It should be noted that the exposure area that a laser system can ablate depends on the size of the optics as well as the total energy needed to ablate the material. Therefore, the RFID circuit must be kept to a dimension in order to accommodate the optics of the laser system, and the conductive material should be chosen to have low ablation energy. The metal layer can be exposed multiple times in order to accumulate the amount of energy needed for the ablation to be complete.

Figure 8:
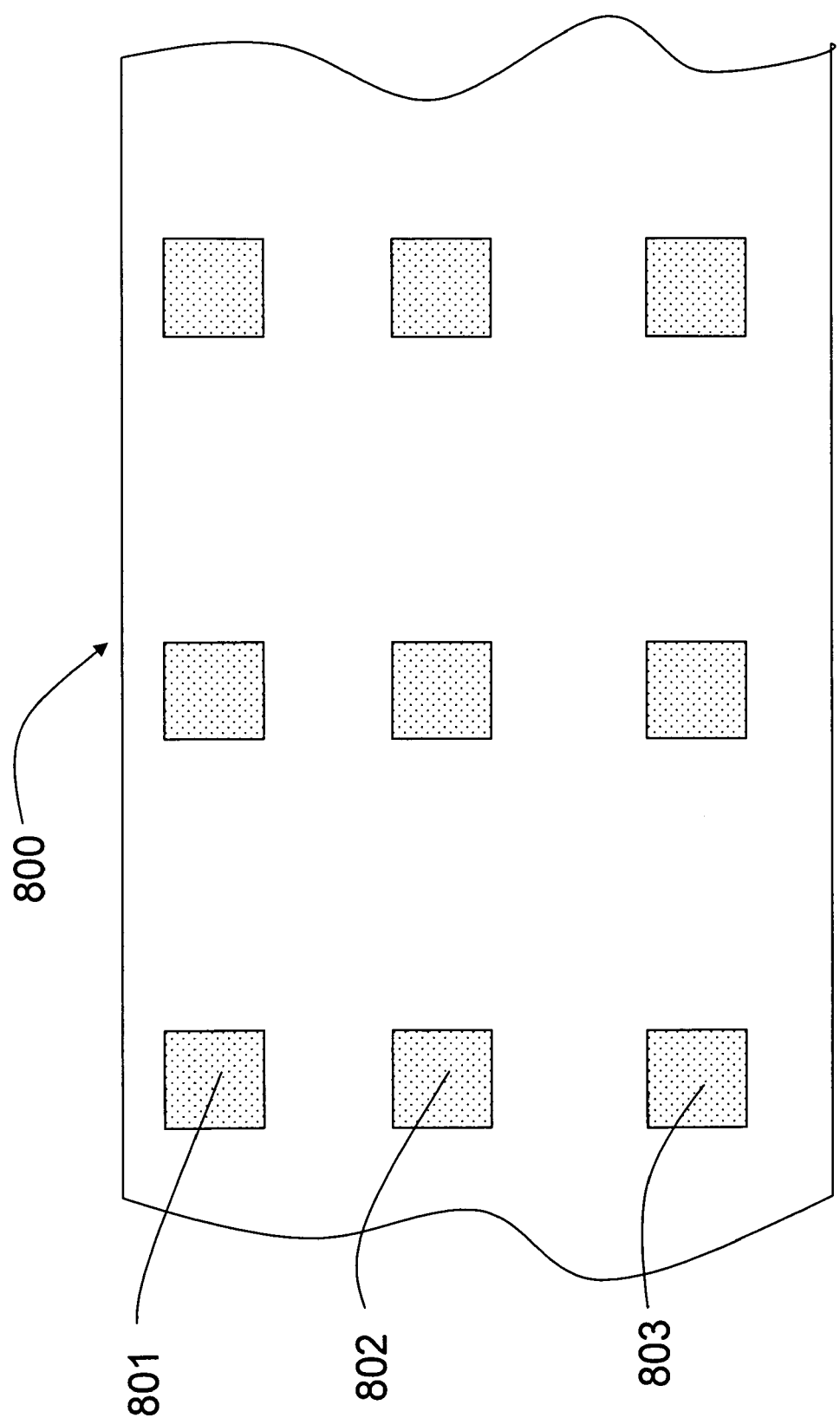
FIG. 8 illustrates a method by which laser ablation is utilized in high volume production of printed RFID tags.

FIG. 8 illustrates a method by which laser ablation is utilized in high volume production of printed RFID tags. In this embodiment, the need to pattern the antenna metal by ablation is removed, thereby providing two advantages. The first advantage is that the laser light is concentrated on a smaller area, thereby making it possible to increase the ablation energy per unit area and enabling the ablation of a wider selection of materials. The second advantage is the material cost savings produced by reducing how much metal is removed. In this embodiment, a substrate 800 has separate rectangles 801, 802, and 803 of a continuous layer of metal in those areas where individual RFID tag circuits are to be formed. These rectangles can be produced by printing conductive polymer, nano-particle metal ink, another conductive ink formulation. Alternatively, this metal could be deposited by a masked evaporative or sputtered metal system. The pattern of metal rectangles is repeated across the entire substrate where the circuit of the RFID tag is to be formed. A space between the metal rectangles is designed to accommodate a printed metal antenna 704 around each circuit at a later time. In another embodiment, the antenna coil is printed before laser ablation.

Substrate 800 represents either an individual sheet or part of a roll-to-roll web. In the case of an individual sheet, the laser head steps and repeats over each rectangle, thereby aligning the laser head to expose each rectangle individually, thereby patterning all transistors of one RFID tag at a time. The same method can be utilized when substrate 800 is a roll-to-roll web. However, in this circumstance, the web would need to stop as the laser head steps across the web. It would be desirable if a single exposure can accommodate the entire width of the web, therefore allowing the web to move continuously in the direction of the web. This can be accomplished by using a system with multiple laser heads, one head for each RFID circuit across the web. These laser heads then fire at the same time, ablating all RFID tags along the width of the web.

Figure 12:
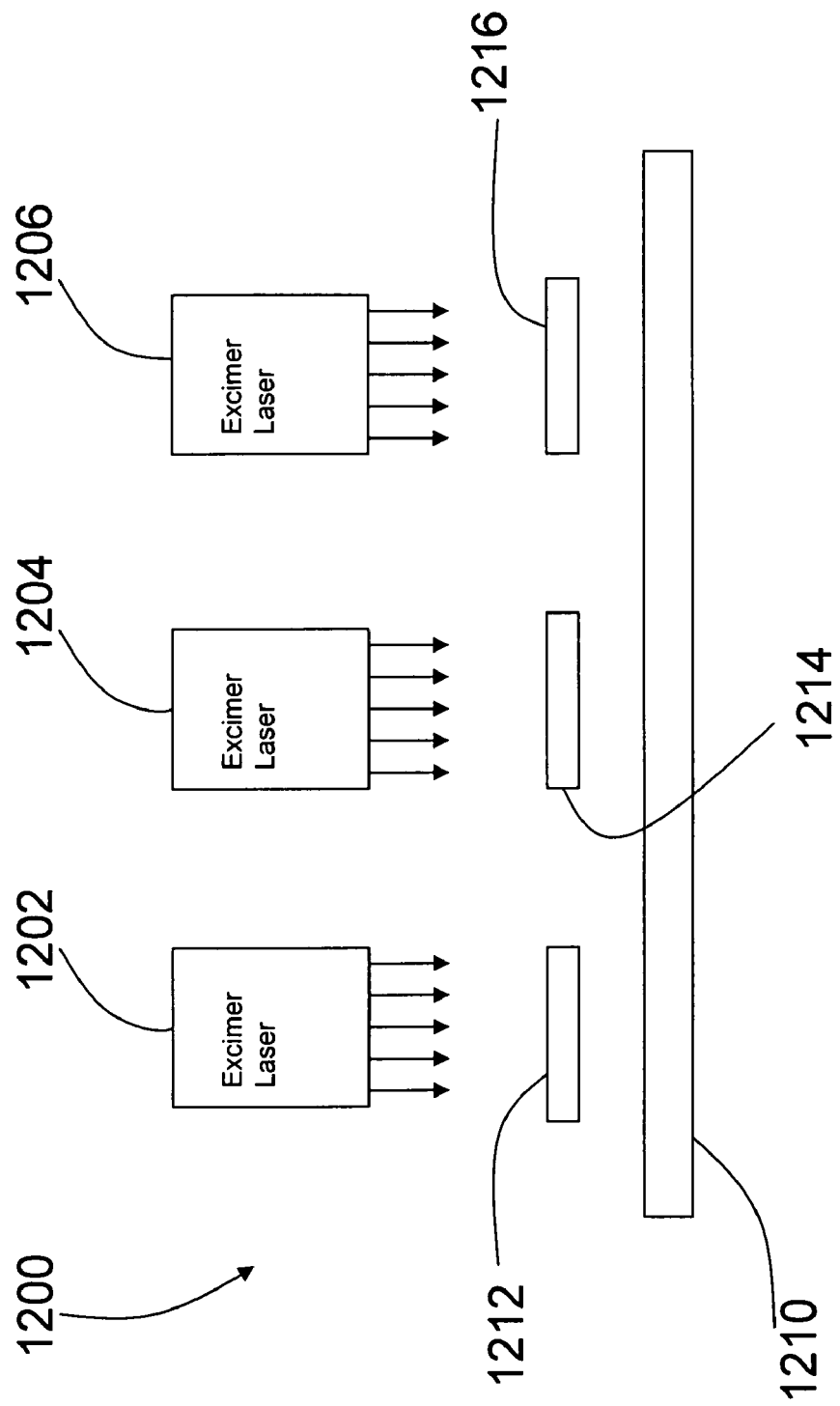
FIG. 12 is a laser ablation system including a plurality of excimer lasers according to the present invention.

Such a laser ablation system 1200 can be seen in FIG. 12, which includes excimer lasers 1202, 1204, and 1206, corresponding to metal rectangles 801, 802, and 803. Excimer lasers 1202, 1204, and 1206 are placed above metal squares on substrate 1210. Masks 1212, 1214, and 1216 are used to direct the laser light to pattern each metal square. The excimer lasers 1202, 1204, and 1206 are aligned with masks 1212, 1214, and 1216 and the metal squares below on substrate 1210. There is one mask for each laser across the web. These masks are used to pattern the laser light onto the corresponding square, thereby performing a laser ablation on the metal square. It should be noted that the diagrams of FIGS. 4, 5, and 6 illustrate how an opening on the single mask blocks the light in the non-image areas, whereas in FIG. 12, the entire mask is shown. Masks 1212, 1214, and 1216 have openings corresponding to areas where ablation is desired on the metal squares on substrate 1210. While three excimer lasers are shown, additional excimer lasers can be used if desired such that more RFID tags can be accommodated in a single row across the web.

Figure 9:
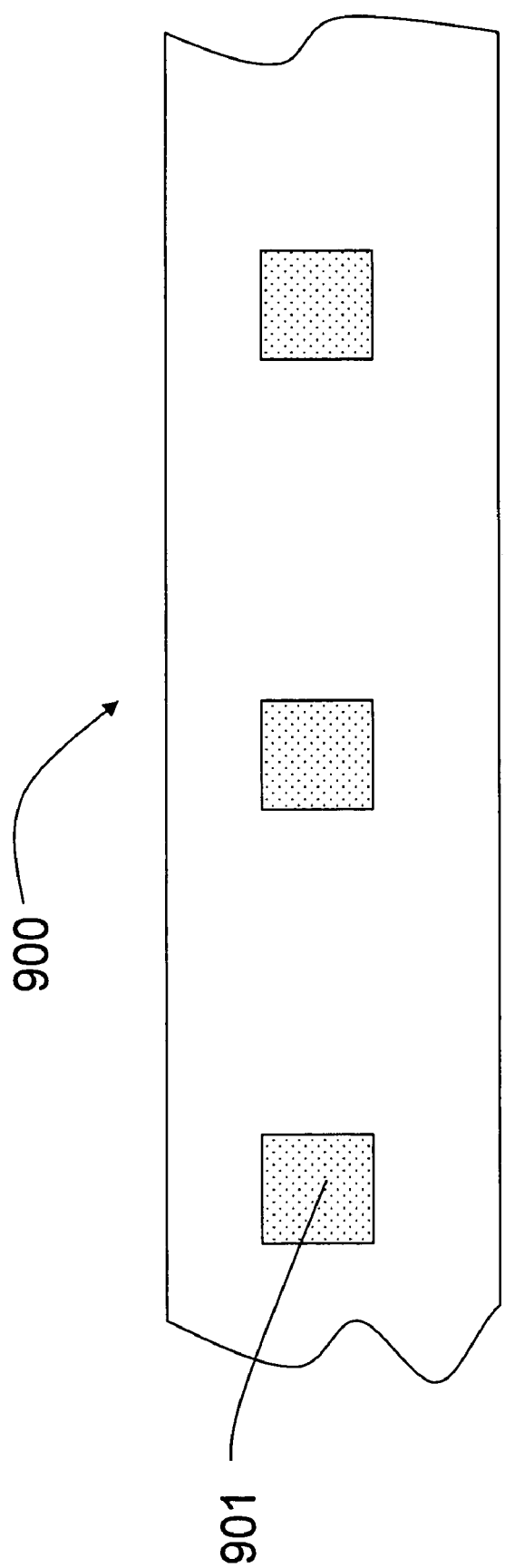
FIG. 9 illustrates another method by which RFID tags can be produced by a continuous roll-to-roll web.

FIG. 9 illustrates another method by which RFID tags can be produced by a continuous roll-to-roll web. In this embodiment, web 900 is made sufficiently narrow to accommodate only a single RFID tag. A metal rectangle 901 is deposited where the circuit of the RFID is to be formed. Sufficient space is permitted between metal squares and in the width of the web to allow the printing of an antenna around the circuit at a later step.

Figure 10:
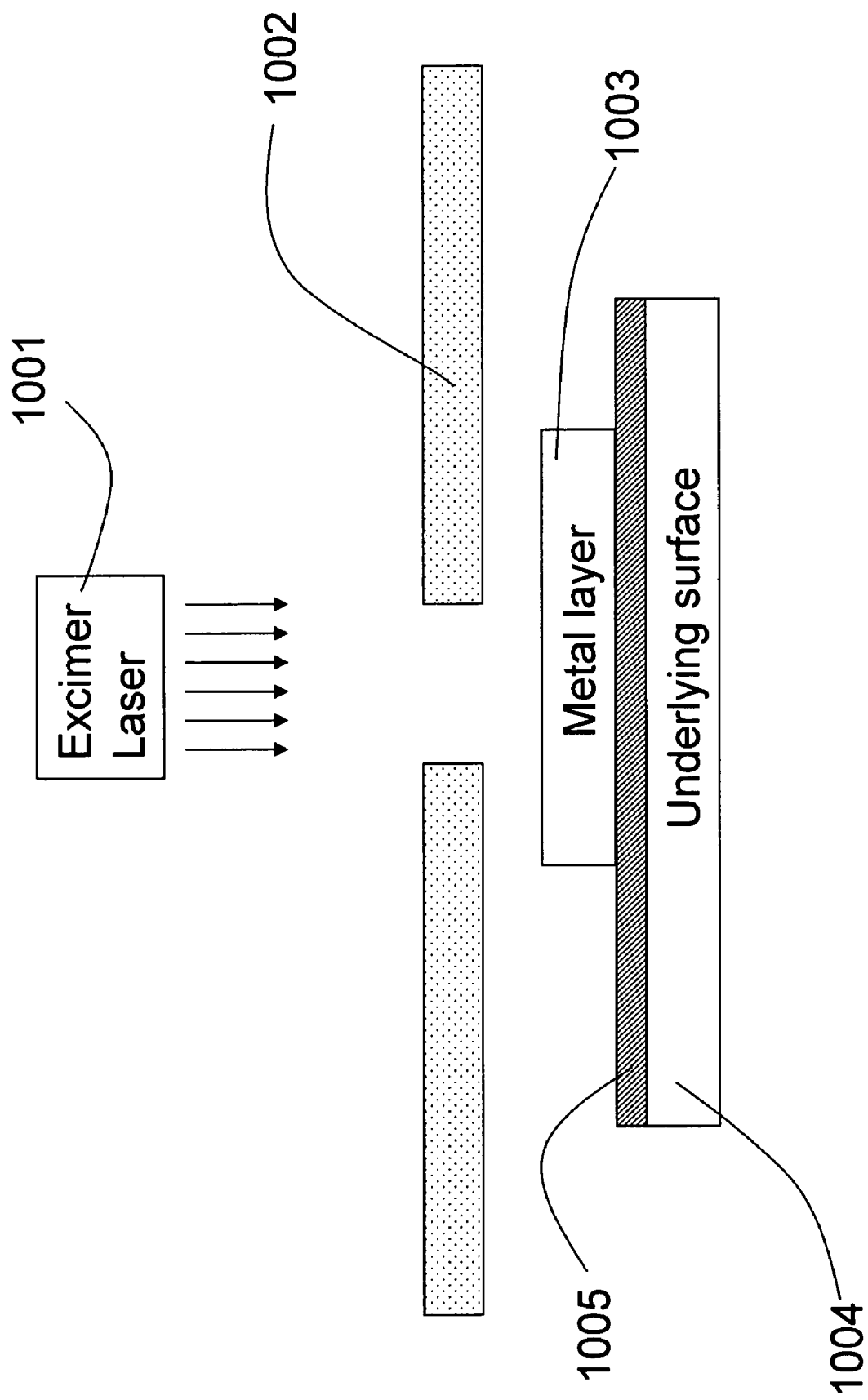
FIG. 10 illustrates a method by which the layer to be ablated can be better distinguished from the layer underneath it.

FIG. 10 illustrates a method by which the layer to be ablated 1003 can be better distinguished from the layer 1004 underneath it. Such distinction makes it possible to ablate the layer to be ablated, but leave the layer underneath unaltered. The layer 1003 is different, depending on which organic transistor structure is being fabricated. In this embodiment, another layer of material 1005 is added which is electrically benign. This material has a higher ablation energy than the conductor being ablated, and should be an insulator in order to remain electrically benign. In another embodiment, the layer 1004 is treated with a chemical to harden the surface or to increase its reflectivity in order to become more resistant towards laser ablation of the layer 1003 above it.

Figure 11:
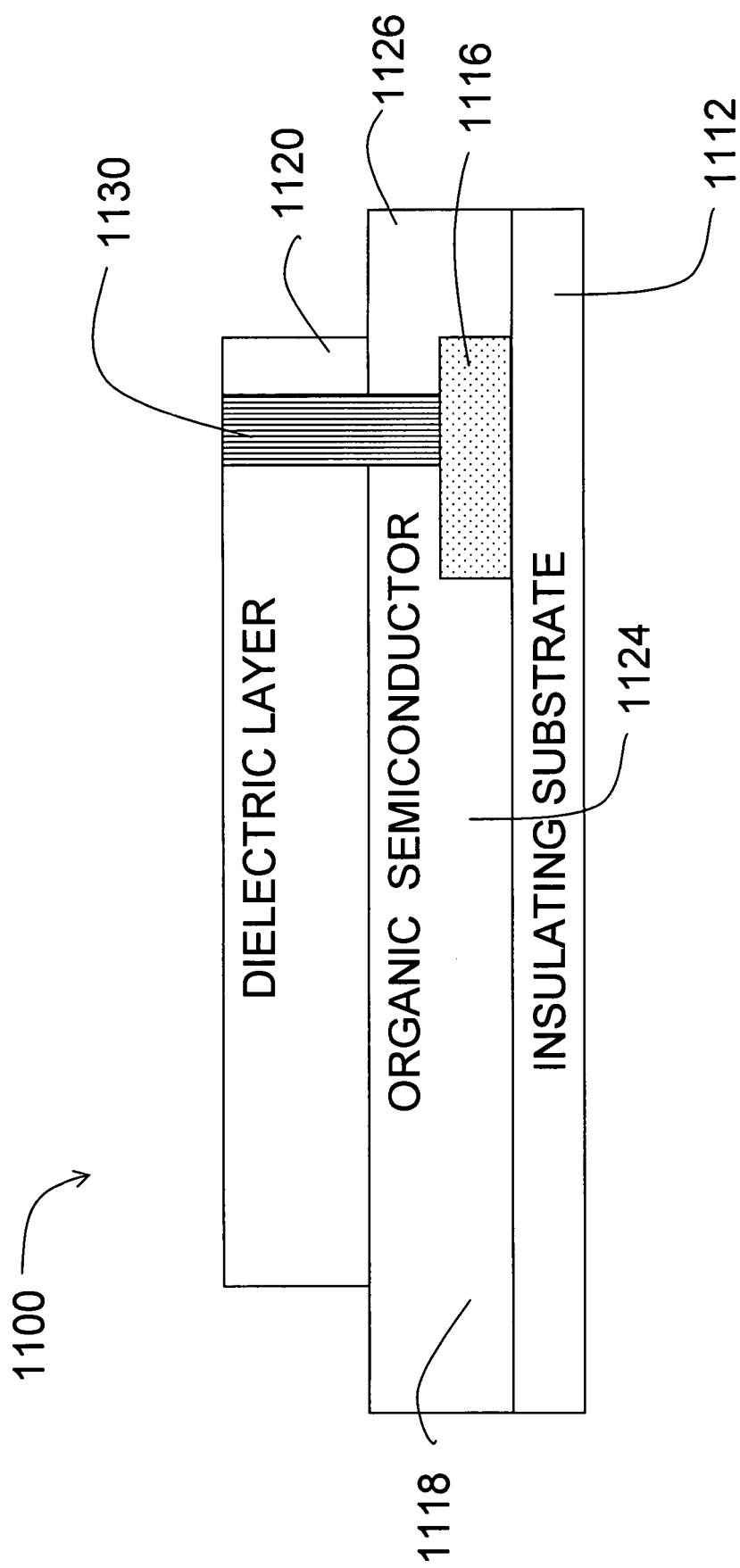
FIG. 11 illustrates the use of a laser ablation system to form holes through the layers of dielectric and semiconductor to form holes which serve as an interconnect between metal layers.

Referring now to FIG. 11, structure 1100 illustrates the use of laser ablation in order to form a hole 1130 through dielectric 1120 and semiconductor 1126 to make contact with metal pad 1116. In a subsequent step, metal is deposited thereby connecting metal pad 1116 with the metal above it to form a method of providing interconnect between the two metal layers. Alternatively, this hole could be formed by leaving a hole in the dielectric and the semiconductor when those layers are printed. However, the resolution of the print process results in a much larger hole 1130 than if it is laser ablated. In addition, the dielectric must generally be printed with a hole even larger than the resolution would allow since an alignment tolerance must be taken into account to ensure that the printed dielectric hole overlaps the hole printed in the organic semiconductor.

While the invention has been described in detail in the foregoing description and illustrative embodiment, it will be appreciated by those skilled in the art that many variations may be made without departing from the spirit and scope of the invention. Thus, it may be understood, for example, that the structures above could include self-assembled monolayers (SAMs), corona treatment, or other surface treatments to obtain desired surface energy and contact angles for optimized print characteristics. The metal layers may contain another conductive layer between the source/drain or gate layers and the surface upon which it is printed in order to promote enhanced adhesion, to increase or decrease wetting of the print surface. Metal layers may be treated with gold immersion or thiol processing to reduce oxidation, increase the effective work function of the metal, and promote desired alignment of the semiconductor polymer and crystalline structures. Various curing steps either at each deposition step or at the end of the entire process may also be included.

I claim:

1. A method of forming an organic transistor comprising using laser ablation to define a metal layer in an organic transistor to form a source and a drain of the organic transistor, and a gap there between defining the channel length, and to simultaneously pattern a plurality of transistors and a printed antenna in an RFID circuit.

2. A method of forming an organic transistor comprising using laser ablation to define a metal layer in an organic transistor to form a source and a drain of the organic transistor, and a gap there between defining the channel length, and to simultaneously pattern a plurality of transistors in an RFID circuit.

3. The method of claim 2 wherein the ablation resolution is between 2 μm and 4 μm.

4. The method of claim 2, further comprising forming a top gate organic transistor structure.

5. The method of claim 2, further comprising forming a bottom gate, top contact organic transistor structure.

6. The method of claim 2, further comprising forming a bottom gate, bottom contact organic transistor structure.

7. A method of forming an organic transistor comprising using laser ablation to define a metal layer in an organic transistor to form a source and a drain of the organic transistor, and a gap there between defining the channel length, and to simultaneously pattern a plurality of transistors and printed antennas in a plurality of RFID circuits.

8. The method of claim 7 wherein the ablation resolution is between 2 μm and 4 μm.

9. The method of claim 7, further comprising forming a top gate organic transistor structure.

10. The method of claim 7, further comprising forming a bottom gate, top contact organic transistor structure.

11. The method of claim 7, further comprising forming a bottom gate, bottom contact organic transistor structure.

12. A method of forming an organic transistor comprising using laser ablation to define a metal layer in an organic transistor to form a source and a drain of the organic transistor, and a gap there between defining the channel length, and to simultaneously pattern a plurality of transistors in a plurality of RFID circuits.

13. The method of claim 12 wherein the ablation resolution is between 2 μm and 4 μm.

14. The method of claim 12, further comprising forming a top gate organic transistor structure.

15. The method of claim 12, further comprising forming a bottom gate, top contact organic transistor structure.

16. The method of claim 12, further comprising forming a bottom gate, bottom contact organic transistor structure.

17. A method of forming an organic transistor comprising using multiple exposures of laser ablation to define a metal layer in an organic transistor to form a source and a drain of the organic transistor, and a gap there between defining the channel length.

18. A method of forming an organic transistor comprising:
using laser ablation to define a metal layer in an organic transistor to form a source and a drain of the organic transistor, and a gap there between defining the channel length; and
depositing a single column of metal rectangles where an RFID circuit is to be formed, and sequentially ablating each metal rectangle.

19. A method of forming an organic transistor comprising:
using laser ablation to define a metal layer in an organic transistor to form a source and a drain of the organic transistor, and a gap there between defining the channel length;
depositing a plurality of columns of metal rectangles where a plurality of RFID circuits are to be formed;
simultaneously ablating a row of metal rectangles; and
simultaneously ablating sequential rows of metal rectangles.

20. A method of forming an organic transistor comprising:
using laser ablation to define a metal layer in an organic transistor to form a source and a drain of the organic transistor, and a gap there between defining the channel length; and
using multiple laser heads to simultaneously expose a plurality of RFID circuits.

21. A method of forming an organic transistor comprising:
using laser ablation to define a metal layer in an organic transistor to form a source and a drain of the organic transistor, and a gap there between defining the channel length; and
using a single laser head to expose a single RFID circuit.

22. A method of forming an organic transistor comprising:
using laser ablation to define a metal layer in an organic transistor to form a source and a drain of the organic transistor, and a gap there between defining the channel length; and
forming a stopping layer below the metal layer.

23. The method of claim 22 wherein forming a stopping layer comprises forming a self-assembled monolayer (SAM).

24. A method of forming an organic transistor comprising:
using laser ablation to define a metal layer in an organic transistor to form a source and a drain of the organic transistor, and a gap there between defining the channel length; and
treating a top surface of an additional layer below the metal layer to make the additional layer more resistant to laser light.

25. A method of forming an organic transistor comprising using laser ablation to define a metal layer in an organic transistor to form a source and a drain of the organic transistor, and a gap there between defining the channel length; and
utilizing laser ablation for cuts into a dielectric layer of the organic transistor to form contacts.

* * * * *